(12) United States Patent
Wieland et al.

(10) Patent No.: US 8,502,176 B2
(45) Date of Patent: Aug. 6, 2013

(54) IMAGING SYSTEM

(75) Inventors: Marco Jan-Jaco Wieland, Delft (NL); Alexander Hendrik Vincent Van Veen, Rotterdam (NL)

(73) Assignee: Mapper Lithography IP B.V., Delft (NL)

( * ) Notice: Subject to any disclaimer, the term of this patent is extended or adjusted under 35 U.S.C. 154(b) by 155 days.

(21) Appl. No.: 12/994,230

(22) PCT Filed: May 22, 2009

(86) PCT No.: PCT/EP2009/056230
§ 371 (c)(1),
(2), (4) Date: Nov. 23, 2010

(87) PCT Pub. No.: WO2009/141428
PCT Pub. Date: Nov. 26, 2009

(65) Prior Publication Data
US 2011/0079730 A1    Apr. 7, 2011

Related U.S. Application Data

(60) Provisional application No. 61/055,839, filed on May 23, 2008.

(51) Int. Cl.
*G21K 5/00*    (2006.01)
(52) U.S. Cl.
USPC ............... 250/492.3; 250/492.22; 250/492.1; 250/492.23
(58) Field of Classification Search
None
See application file for complete search history.

(56) References Cited

U.S. PATENT DOCUMENTS

| 5,905,267 A | 5/1999 | Muraki |
| 6,897,458 B2 * | 5/2005 | Wieland et al. ............ 250/494.1 |

(Continued)

FOREIGN PATENT DOCUMENTS

| GB | 2340991 A | 3/2000 |
| WO | 2006126872 A1 | 11/2006 |
| WO | WO 2006126872 A1 * | 11/2006 |
| WO | 2007013802 A1 | 2/2007 |

OTHER PUBLICATIONS

Search report of for GB0809425.2 (issued Sep. 18, 2008).

(Continued)

*Primary Examiner* — Andrew Smyth
(74) *Attorney, Agent, or Firm* — Hoyng Monegier LLP; David P. Owen; Coraline J. Haitjema

(57) ABSTRACT

A charged particle multi-beamlet system for exposing a target (11) using a plurality of beamlets. The system comprises a charged particle source (1) for generating a charged particle beam (20), a beamlet aperture array (4D) for defining groups of beamlets (23) from the generated beam, a beamlet blanker array (6) comprising an array of blankers for controllably blanking the beamlets (23), a beam stop array (8) for blanking beamlets (23) deflected by the blankers, the beam stop array (8) comprising an array of apertures, each beam stop aperture corresponding to one or more of the blankers, and an array of projection lens systems (10) for projecting beamlets on to the surface of the target. The system images the source (1) onto a plane at the beam stop array (8), at the effective lens plane of the projection lens systems (10), or between the beam stop array (8) and the effective lens plane of the projection lens systems (10), and the system images the beamlet aperture array (4D) onto the target (11).

9 Claims, 4 Drawing Sheets

(56) References Cited

U.S. PATENT DOCUMENTS

| | | | |
|---|---|---|---|
| 7,091,504 B2 * | 8/2006 | Wieland et al. | 250/494.1 |
| 2002/0160311 A1 * | 10/2002 | Muraki et al. | 430/296 |
| 2003/0155534 A1 * | 8/2003 | Platzgummer et al. | 250/492.22 |
| 2003/0209674 A1 * | 11/2003 | Hamaguchi et al. | 250/396 ML |
| 2004/0119021 A1 * | 6/2004 | Parker et al. | 250/396 R |
| 2005/0023486 A1 * | 2/2005 | Takakuwa et al. | 250/492.2 |
| 2005/0161621 A1 * | 7/2005 | Wieland et al. | 250/492.23 |
| 2007/0134940 A1 * | 6/2007 | Hirukawa | 438/780 |

OTHER PUBLICATIONS

International search report for the present application (issued Sep. 29, 2009).

* cited by examiner

IMAGING SYSTEM

BACKGROUND OF THE INVENTION

1. Field of the Invention

The present invention relates to an imaging system, and in particular to a charged particle multi beamlet lithography system or inspection system.

2. Description of the Related Art

Currently, most commercial lithography systems use a mask as a means to store and reproduce the pattern data for exposing a target, such as a wafer with a coating of resist. In a maskless lithography system, beamlets of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

One type of design used for charged particle multi-beamlet systems is shown for example in U.S. Pat. No. 5,905,267, in which an electron beam is expanded, collimated and split by an aperture array into a plurality of beamlets. The obtained image is then reduced by a reduction electron optical system and projected onto a wafer. The reduction electron optical system focuses and demagnifies all the beamlets together, so that the entire set of beamlets is imaged and reduced in size. In this design, all the beamlets cross at a common cross-over, which introduces distortions and reduction of the resolution due to interactions between the charged particles in the beamlets.

Designs without such a common cross-over have also been proposed, in which the beamlets are focused and demagnified individually. However, when such a system is constructed having a large number of beamlets, providing multiple lenses for controlling each beamlet individually becomes impractical. The construction of a large number of individually controlled lenses adds complexity to the system, and the pitch between the lenses must be sufficient to permit room for the necessary components for each lens and to permit access for individual control signals to each lens. The greater height of the optical column of such a system results in several drawbacks, such as the increased volume of vacuum to be maintained and the long path for the beamlets which increases e.g. the effect of alignment errors caused by drift of the beamlets.

Furthermore, existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 60 wafers per hour.

BRIEF SUMMARY OF THE INVENTION

The present invention aims to provide a multiple beamlet charged particle lithography system able to achieve smaller critical dimensions, for example 22 nm, while maintaining sufficient wafer throughput, for example between 10 and 60 wafers per hour. The insight underlying the present invention is that this higher resolution can be obtained in a multi-beamlet charged particle system by considerably reducing the spot size while at the same time considerably increasing the current generated in the system.

Not only is a reduced spot size required to achieve the desired performance, but also a reduced point spread function of beamlets is required to maintain sufficient exposure latitude. Sufficient exposure latitude requires a relatively high ratio of peak exposure level on the target from a beamlet compared to base or background level of exposure as normally caused by the peripheral Gaussian parts of neighbouring beamlets. Designing a system to generate beamlets having a smaller point spread function, however, considerably reduces the charged particle current that may be applied to the target by each beamlet.

The requirements of reduced spot size, increased current, and reduced point spread function implies a considerable increase in the number of beamlets in the system. This creates a problem due to the limited physical dimensions of the projection optics in a multi-beamlet system, which are typically limited to a size corresponding to the size of the die to be exposed. The number of projection lenses that can be constructed within such dimensions using known techniques is considerably smaller than the number of beamlets required to achieve the desired wafer throughput given the above requirements.

The present invention addresses this problem by providing an imaging system having multiple beamlets per projection lens. In one aspect the invention provides for a system having a reduced number of elements in the imaging system, resulting in a less complex and less costly system. In another aspect the invention provides for a system having a shorter projection column, reducing the effect of drift of the charged particles and reducing the size of the system housing.

In one aspect the present invention provides a charged particle multi-beamlet system for exposing a target using a plurality of beamlets. The system includes a charged particle source for generating a charged particle beam, a beamlet aperture array for defining groups of beamlets from the generated beam, a beamlet blanker array comprising an array of blankers for controllably blanking the beamlets, a beam stop array for blocking beamlets deflected by the blankers, the beam stop array comprising an array of apertures, each beam stop aperture corresponding to one or more of the blankers, and an array of projection lens systems for projecting beamlets on to the surface of the target, wherein the system images the source onto a plane at the beam stop array, at the effective lens plane of the projection lens systems, or between the beam stop array and the effective lens plane of the projection lens systems, and the system images the beamlet aperture array onto the target.

The source may be imaged onto a plane at or between the beam stop array and the effective lens plane of the projection lens systems using a condenser lens array, and the condenser lens array is preferably positioned upstream of the beamlet aperture array, thus reducing column length. In a further aspect, the beamlet blanker array plane is imaged on the target rather than onto the plane of the beam stop array as in prior systems. The system may also include a sub-beam aperture array for defining sub-beams from the generated beam, wherein the beamlet aperture array defines the groups of beamlets from the sub-beams. The sub-beams are preferably focused onto a plane at or between the beam stop array and the effective lens plane of the projection lens systems by a condenser lens array, and the condenser lens array is preferably positioned between the sub-beam aperture array and the beamlet aperture array.

In another aspect the system also provides a charged particle multi-beamlet system for exposing a target using a plurality of beamlets. The system includes a charged particle source for generating a charged particle beam, a first aperture array for defining groups of beamlets from the generated beam, a second aperture array, a beamlet blanker array comprising an array of blankers for controllably blanking the beamlets, a beam stop array for blanking beamlets deflected by the blankers, the beam stop array comprising an array of apertures, each beam stop aperture corresponding to a plurality one or more of the blankers, and an array of projection lens systems for projecting beamlets on to the surface of the target, wherein the system images the source onto a plane at the beamlet blanker array, and the system images the beamlet blanker array onto the target. The source may be imaged onto the target via a plane at the beamlet blanker array by a first condenser lens array. A further aspect of this design is that the first aperture array is imaged onto the plane of the beam stop array.

The system may also include a second condenser lens array for converging the groups of beamlets onto a plane at or between the beam stop array and the effective lens plane of the projection lens systems. Each lens of the condenser lens array preferably focuses a group of beamlets to a corresponding aperture in the beam stop array. Alternatively the system may include a beamlet manipulator for converging the groups of beamlets towards a common point of convergence for each group, instead of the second condenser lens array. The common point of convergence for each group of beamlets is preferably at a corresponding aperture in the beam stop array, and the beamlet manipulator may comprise a beamlet group deflector.

In a further aspect, the invention provides a system comprising at least one charged particle source for generating a charged particle beam, a first aperture array for creating sub-beams from the generated beam, a condenser lens array for focusing the sub-beams, a second aperture array for creating a group of beamlets from each focused sub-beam, a beamlet blanker for controllably blanking beamlets in the groups of beamlets, and an array of projection lens systems for projecting beamlets on to the surface of the target, where the condenser lens array is adapted for focusing each sub-beam at a point corresponding to one of the projection lens systems.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings.

Figure 1:
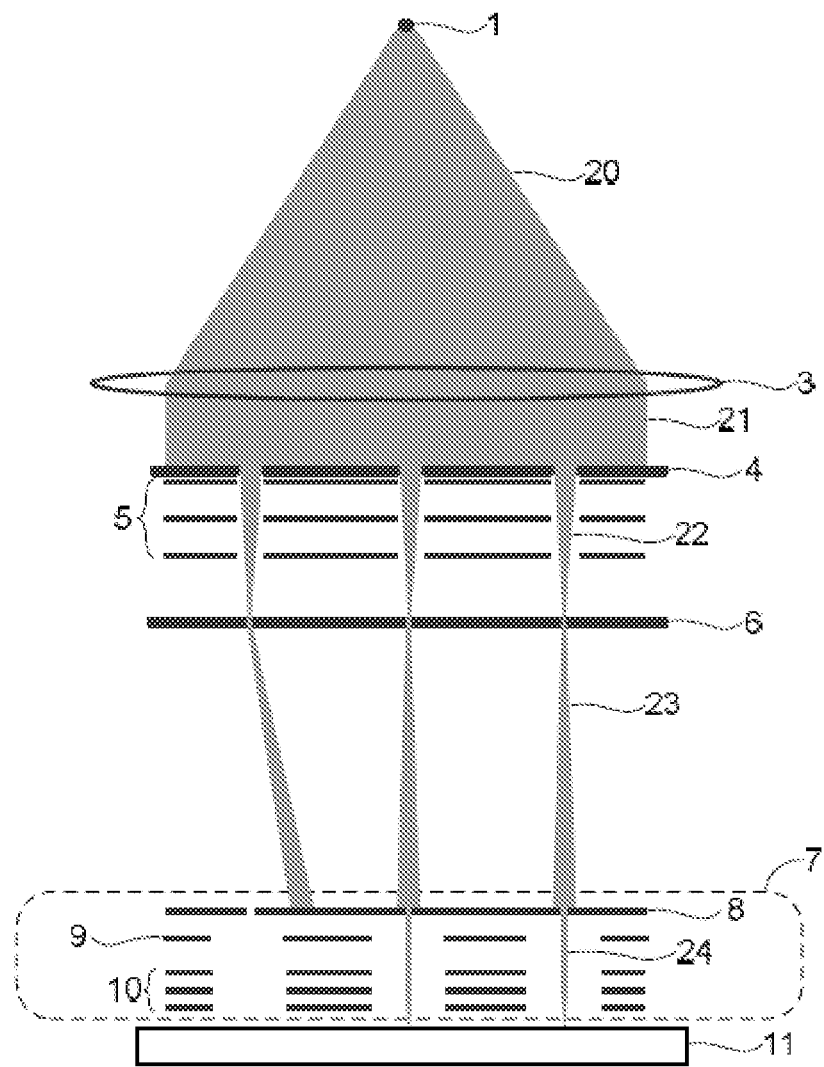
FIG. 1 is a simplified schematic overview of an example of a charged particle multi-beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897, 458 and 6,958,804 and 7,019,908 and 7,084,414 and 7,129, 502, U.S. patent application publication no. 2007/0064213, and copending U.S. patent application Ser. Nos. 61/031,573 and 61/045,243, which are all assigned to the owner of the present invention and are all hereby incorporated by reference in their entirety.

In the embodiment shown in FIG. 1, the lithography system comprises an electron source 1 for producing a homogeneous, expanding electron beam 20. Note that the electrons will appear to originate from a point above the source, i.e. a virtual source above the source 1, where there will be a virtual cross-over of the electrons, as describe in U.S. Pat. No. 6,897, 458. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a collimator lens 3 to produce a collimated electron beam 21, which impinges on an aperture array 4, which blocks part of the beam and allows a plurality of beamlets 22 to pass through the aperture array. The aperture array 4 preferably comprises a plate having through holes. Thus, a plurality of parallel electron beamlets 22 is produced. The system generates a large number of beamlets 22, preferably about 10,000 to 1,000,000 beamlets, although it is of course possible to use more or less beamlets. Note that other known methods may also be used to generate the collimated beam 21, and other known methods may also be used to generate the beamlets 22.

The plurality of electron beamlets 22 pass through a condenser lens array 5 which focuses the electron beamlets 22 in the plane of a beamlet blanker array 6. In this way the source 1 is imaged onto the beamlet blanker array 6. Condenser lens array 5 is preferably constructed similarly to the array of projection lens systems described below, and preferably comprises plates or substrates with apertures formed in them. Three substrates are shown in FIG. 1 although fewer or more substrates may be used, it being preferred to use as few substrates as possible to reduce the complexity and cost of the system. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the substrate using techniques well known in the semiconductor manufacturing industry, for example. An electrical voltage is applied to each electrode to generate electrostatic lenses at the location of each aperture, the strength of the lenses being dependent on the voltage used. Each electrode is controlled by a single control voltage for the complete array. Thus, in the embodiment shown with three electrodes there will be only three voltages for all the thousands of lenses of the condenser array.

It should be noted that the condenser lens array (in any of the embodiments) may comprise a single condenser lens array or a set of condenser lens arrays, as would be known to a person of skill in the field of electron-optics.

This beamlet blanker array 6 preferably comprises a plurality of blankers which are each capable of deflecting one or more of the beamlets 22. The beamlet blanker array 6 is described in more detail below, and details of the beamlet blanker array and data path for controlling the beamlet blanker array are also provided in U.S. Pat. Nos. 6,958,804 and 7,019,908, U.S. patent application publication no. 2007/0064213, and copending U.S. patent application Ser. No. 61/045,243.

Subsequently, the beamlets 22 enter end module 7. The end module 7 is preferably constructed as an insertable, replaceable unit which comprises various components. In this embodiment, the end module comprises a beam stop array 8, a beam deflector array 9, and a projection lens arrangement 10, although not all of these need be included in the end module and they may be arranged differently. The end module 7 will, amongst other functions, provide a demagnification of about 25 to 500 times, preferably in the range 50 to 200 times. A slightly lesser demagnification is required in systems generating patterned beamlets, in the range 25 to 100 times, as described below for the systems of FIGS. 4 and 5. The end module 7 preferably deflects the beamlets as described below. After leaving the end module 7, the beamlets 22 impinge on a surface of a target 11 positioned at a target plane. For lithography applications, the target usually comprises a wafer provided with a charged-particle sensitive layer or resist layer.

In the end module 7, the undeflected electron beamlets 22 first pass beam stop array 8. This beam stop array 8 largely determines the opening angle of the beamlets. In this embodiment, the beam stop array comprises an array of apertures for allowing beamlets to pass through. The beam stop array, in its basic form, comprises a substrate provided with through holes, typically round holes although other shapes may also be used. In one embodiment, the substrate of the beam stop array 8 is formed from a silicon wafer with a regularly spaced array of through holes, and may be coated with a surface layer of a metal to prevent surface charging. In one embodiment, the metal is of a type which does not form a native-oxide skin layer, such as CrMo.

Each opening or aperture in the beam stop array 8 corresponds with one or more elements of the beamlet blanker array 6. In one embodiment, the openings in the beam stop array 8 are aligned with the elements of the beamlet blanker array 6. The beamlet blanker array 6 and beam stop array 8 operate together to block or let pass the beamlets 22. If beamlet blanker array 6 deflects a beamlet, it will not pass through the corresponding aperture in beam stop array 8, but instead will be blocked by the substrate of beam stop array 8. But if beamlet blanker array 6 does not deflect a beamlet, then it will pass through the corresponding aperture in beam stop array 8 and will then be projected as a spot on the surface of target 11. In this way the individual beamlets may be effectively switched on and off.

Next, the beamlets pass through a beam deflector array 9 which provides for deflection of each beamlet 21 in the X and/or Y direction, substantially perpendicular to the direction of the undeflected beamlets 22. Where the wafer is supported on a stage providing mechanical movement in the X-direction, the deflection in the X-direction may be small and used to correct for errors in the stage positioning, and deflection in the Y-direction larger, preferably in the range of 2 µm. Separate deflectors may be provided for deflection in each direction, and more than one deflector array may be used for deflection in the Y-direction. Next, the beamlets 22 pass through projection lens arrangement 10 and are projected onto a target 11, typically a wafer, in a target plane.

For consistency and homogeneity of current and charge both within a projected spot and among the projected spots on the target, and as beam stop plate 8 largely determines the opening angle of a beamlet, the diameter of the apertures in beam stop array 8 are preferably smaller than the diameter of the beamlets when they reach the beam stop array. In one embodiment, the apertures in beam stop array 8 have a diameter are in a range of 5 to 20 µm, while the diameter of the beamlets 22 impinging on beam stop array 8 in the described embodiment are typically in the range of about 15 to 75 µm.

The diameter of the apertures in beam stop plate 8 in the present example limit the cross section of a beamlet, which would otherwise be of a diameter value within the range of 30 to 75 µm, to the above stated value within the range of 5 to 20 µm, and more preferably within the range of 5 to 10 µm. In this way, only a central part of a beamlet is allowed to pass through beam stop plate 8 for projection onto target 11. This central part of a beamlet has a relatively uniform charge density. Such cut-off of a circumferential section of a beamlet by the beam stop array 8 also largely determines the opening angle of a beamlet in the end module 7 of the system, as well as the amount of current at the target 11. In one embodiment, the apertures in beam stop array 8 are round, resulting in beamlets with a generally uniform opening angle.

Figure 2:
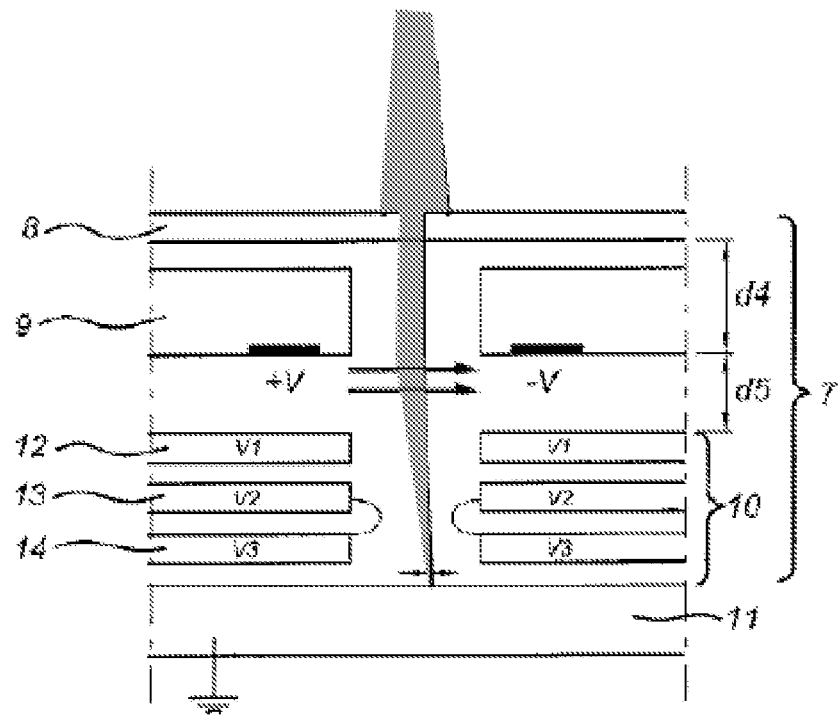
FIG. 2 is a simplified schematic overview, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 22 are projected onto target 11, preferably resulting in a geometric spot size of about 10 to 30 nanometers in diameter, and more preferably about 20 nanometers. The projection lens arrangement 10 in such a design preferably provides a demagnification of about 100 to 500 times. In this embodiment, as shown in FIG. 2, a central part of a beamlet 21 first passes through beam stop array 8 (assuming it has not been deflected by beamlet blanker array 6). Then, the beamlet passes through a deflector or set of deflectors arranged in a sequence forming a deflection system, shown as beam deflector array 9. The beamlet 21 subsequently passes through an electro-optical system of projection lens arrangement 10 and finally impinges on a target 11 in the target plane.

The projection lens arrangement 10, in the embodiment shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. This uniformity permits the elimination of the requirement to individually control the focus and path of each beamlet.

The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example. An electrical voltage is applied to each electrode to generate electrostatic lenses at the location of each aperture, the strength of the lenses being dependent on the voltage used. Each electrode is controlled by a single control voltage for the complete array. Thus, in the embodiment shown with three electrodes lens there will be only three voltages for all the thousands of lenses.

FIG. 2 shows the plates 12, 13, and 14 having electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises the set of electrostatic lenses formed at corresponding points of the arrays of apertures of each plate. Each set of electrostatic lenses forming a projection lens system can be considered as a single effective projection lens, which focuses and demagnifies one or more beamlets, and has an effective focal length and an effective demagnification. In systems where only a single plate is used, a single voltage may be used in conjunction with a ground plane, such that electrostatic lenses are formed at the location of each aperture in the plate.

The projection lens arrangement preferably forms all of the focusing means for focusing the beamlets onto the target surface. This is made possible by the uniformity of the projection lenses, which provide sufficiently uniform focusing and demagnification of the beamlets so that no correction of the focus and/or path of individual electron beamlets is required. This considerably reduces the cost and complexity of the overall system, by simplifying construction of the system, simplifying control and adjustment of the system, and greatly reducing the size of the system.

In one embodiment, the placement and dimensions of the apertures where the projection lenses are formed are controlled within a tolerance sufficient to enable focusing of the electron beamlets using one or more common control signals to achieve a focal length uniformity better than 0.05%. The projection lens systems are spaced apart at a nominal pitch, and each electron beamlet is focused to form a spot on the surface of the target. The placement and dimensions of the apertures in the plates are preferably controlled within a tolerance sufficient to achieve a variation in spatial distribution of the spots on the surface of the target of less than 0.2% of the nominal pitch.

The projection lens arrangement 10 is compact with the plates 12, 13, 14 being located close to each other, so that despite the relatively low voltages used on the electrodes (in comparison to voltages typically used in electron beam optics), it can produce very high electrical fields. These high electrical fields generate electrostatic projection lenses which have a small focal distance, since for electrostatic lenses the focal length can be estimated as proportional to beam energy divided by electrostatic field strength between the electrodes. In this respect, where previously 10 kV/mm could be realized, the present embodiment preferably applies potential differences within the range of 25 to 50 kV/mm between the second plate 13 and third plate 14. These voltages V1, V2, and V3 are preferably set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved dashed lines between plates 13 and 14 in the lens opening. This places the effective lens plane closer to the target and enables the projection lens systems to have a shorter focal length.

The high electrical fields used to generate the electrostatic projection lenses can cause bowing or buckling of the plates 12, 13, 14. Because of the tight tolerances required for the positioning of the projection lenses, even a small amount of bowing of the plates can be detrimental. Struts running across and affixed to the surface of the plates may be used to stiffen the plates to reduce this problem. The struts are preferably constructed of an insulating material to further electrically isolate the plates to further prevent flash-over or shorting of electrical charge.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

In the same way as described for deflection in the Y-direction, deflection in the X-direction may also be performed back and/or forth (in FIG. 2 the X-direction is in a direction into and out of the paper). In the embodiment described, one deflection direction may be used for scanning the beamlets over the surface of a substrate while the substrate is translated in another direction using a scanning module or scanning stage. The direction of translation is preferably transverse to the Y-direction and coinciding with the X-direction.

In the application of the projection system for lithography, a beamlet should be focused and positioned at ultra high precision, with spot sizes of tens of nanometers, with an accuracy in size of nanometers, and a position accuracy in the order of nanometers. The inventors realized that deflecting a focused beamlet, for example several hundreds of nanometers away from the optical axis of a beamlet, would easily result in an out-of-focus beamlet. In order to meet the accuracy requirements, this would severely limit the amount of deflection or the beamlet would rapidly become out of focus at the surface of target 11.

The inventors recognized that the focal length should be of such limited magnitude that any deflector or deflector system should be located before the projection lens despite the evident occurrence of off-axis aberrations with such an arrangement.

The arrangement shown in FIGS. 1 and 2 of the deflection array 9 upstream and projection lens arrangement 10 downstream furthermore allows a strong focusing of beamlet 21, in particular to permit a reduction in size (demagnification) of the beamlets of at least about 100 times, and preferably about 350 times, in systems where each projection lens system focuses only one beamlet (or a small number of beamlets). In systems where each projection lens system focuses a group of beamlets, preferably from 10 to 100 beamlets, as in the systems of FIGS. 4 and 5, each projection lens system provides demagnification of at least about 25 times, and preferably about 50 times. This high demagnification has another advantage in that requirements as to the precision of the apertures and lenses before (upstream of) the projection lens arrangement 10 are much reduced, thereby enabling construction of the lithography apparatus, at a reduced cost. Another advantage of this arrangement is that the column length (height) of the overall system can be greatly reduced. In this respect, it is also preferred to have the focal length of the projection lens small and the demagnification factor large, so as to arrive to a projection column of limited height, preferably less than one meter from target to electron source, and more preferably between about 150 and 700 mm in height. This design with a short column makes the lithography system easier to mount and house, reduces the size of the vacuum chamber required to house the system, and also reduces the effect of drift of the separate beamlets due to the limited column height and shorter beamlet path. The smaller drift reduces beamlet alignment problems and enables a simpler and less costly design to be used. This arrangement, however, puts additional demands on the various components of the end module. Additional details of the end module and projection lens arrangement are provided in copending U.S. patent application Ser. Nos. 61/031,573 and 61/045,243.

Figure 3:
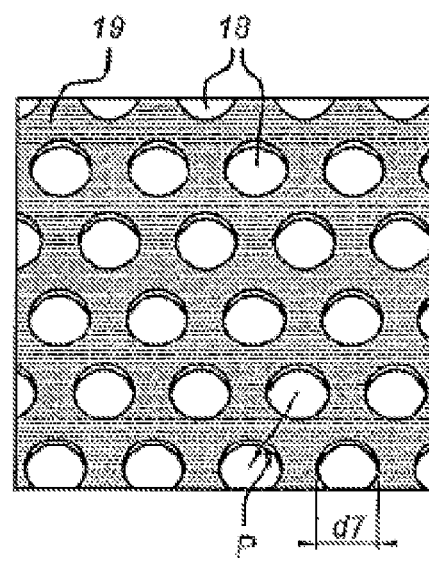
FIG. 3 is a perspective view of a substrate of a lens array of projection lens of FIG. 2.

FIG. 3 is a perspective view of one of the plates 12, 13 or 14, which preferably comprise a substrate, preferably of a material such as silicon, provided with holes 18. The holes may be arranged in triangular (as shown) or square or other suitable relationship with mutual distance P (pitch) between the centre of neighboring holes of about one and a half times the diameter d7 of a hole 18. The substrates of the plates according to one embodiment may be about 20-30 mm square, are preferably located at a constant mutual distance over their entire area. In one embodiment, the substrate is about 26 mm square.

The total current of the beamlets required to achieve a particular throughput (i.e. a particular number of wafers exposed per hour) depends on the required dose, the area of the wafer, and the overhead time (e.g. the time to move a new wafer into position for exposure). The required dose in these shot noise limited systems depends on the required feature size and uniformity, and beam energy, among other factors.

To obtain a certain feature size (critical dimension or CD) in resist using electron beam lithography, a certain resolution is required. This resolution comprises contributions due to the beam size, the scattering of electrons in the resist, and secondary electrons mean free path combined with acid diffusion. These three contributions add up in a quadratic relation to determine the total spot size. Of these three contributions the beam size and the scattering depend on the acceleration voltage. To resolve a feature in the resist the total spot size should be of the same order of magnitude as the desired feature size (CD). Not only the CD but also the CD uniformity is important for practical applications, and this latter requirement will determine the actual required spot size.

For electron beam systems, the maximum single beam current is determined by the spot size. For small spot size the current is also very small. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions between electrons, so that a limited number of beamlets can be sent through one lens and/or one cross-over point. This consequently means that the number of lenses in a high throughput system also needs to be large. In a preferred embodiment, a very dense arrangement of a large number of low energy beamlets is achieved, such that the multiple beamlets can be packed into an area comparable in size to the size of a typical wafer exposure field.

The pitch of the apertures in the plates 12, 13 and 14 of the projection lens is preferably as small as possible to create as many electrostatic lenses as possible in a small area. This enables a high density of beamlets. The large number of beamlets spaced closely together in a high density arrangement also reduces the distance the beamlets must be scanned across the target surface. However, reduction in the pitch for a given bore size of the apertures is limited by manufacturing and structural problems caused when the plate becomes too fragile due to the small distances between the apertures, and by possible aberrations in a lens caused by fringe fields of neighboring lenses.

The multi-beamlet charged particle system is designed to considerably reduce the spot size while at the same time considerably increasing the current generated in the system. In doing so, it was also realized that by increasing the current in the system, the total current on the target is also increased to limit development of shot noise. At the same time, however, the number of electrons impinging on the target surface per square critical dimension (i.e. per unit of area of CD squared) should be maintained constant. These requirements necessitate modification to the design of the charged particle system, as discussed in detail below, and for optimum performance a target with relatively high sensitivity resist is required, by way of example typically from 30 $\mu m/cm^2$ as currently practiced to double that value.

The spot size is preferably in the same order of magnitude as the desired critical dimension (CD) size. Not only is a reduced spot size required to achieve the desired performance, but also a reduced point spread function of beamlets is required to maintain sufficient exposure latitude. Sufficient exposure latitude requires a relatively high ratio of peak exposure level on the target from a beamlet compared to a base or background level of exposure as normally caused by the peripheral Gaussian parts of neighbouring beamlets. Designing a system to generate beamlets having a smaller point spread function, however, considerably reduces the charged particle current that may be applied to the target by each beamlet. Irrespective of the brightness of the charged particle source used, the preceding requirements of reduced spot size, increased current, and reduced point spread function implies a considerably more than linear increase in the number of beamlets in the system compared to the reduction in critical dimension at the same wafer throughput.

The requirement for a considerable increase in the number of beamlets in the system creates a practical problem due to the limited physical dimensions of the projection optics of a multi-beamlet lithography system. The projection optics in such systems are typically limited in size to accommodate, for example the fields of the target to be exposed by the system. There is a limit to the number of lenses that may be physically realized within a relatively small area that the projection optics, i.e. the end projection module may occupy in practical designs. At the reduced critical dimensions to be achieved, the number of lenses that can be constructed within these dimensions using known techniques is considerably smaller than the number of beamlets required to achieve the desired wafer throughput.

One solution is to reduce the image of the aperture array 4 using a condenser lens or series of condenser lenses, thereby also reducing the pitch of the beamlets. However, this solution typically results in a common cross-over of all the beamlets, which causes a significant amount aberration. This is not desirable, particularly in view of the present requirements, and would further complicate the system to counteract this aberration. The solution adopted is to add a group deflector array or a condenser lens array for directing a group of beamlets towards each single projection lens system for projecting onto the target. This minimizes aberration in the system while allowing a disproportionate increase in the number of beamlets in the system.

Because part or all of the plurality of beamlets directed through to each projection lens system may be blanked at any point in time during operation, the system according to the present invention is also referred to as a patterned beamlet system. This patterned beamlet system may also be regarded as a multiplicity of miniaturized imaging systems arranged side by side.

Figure 4:
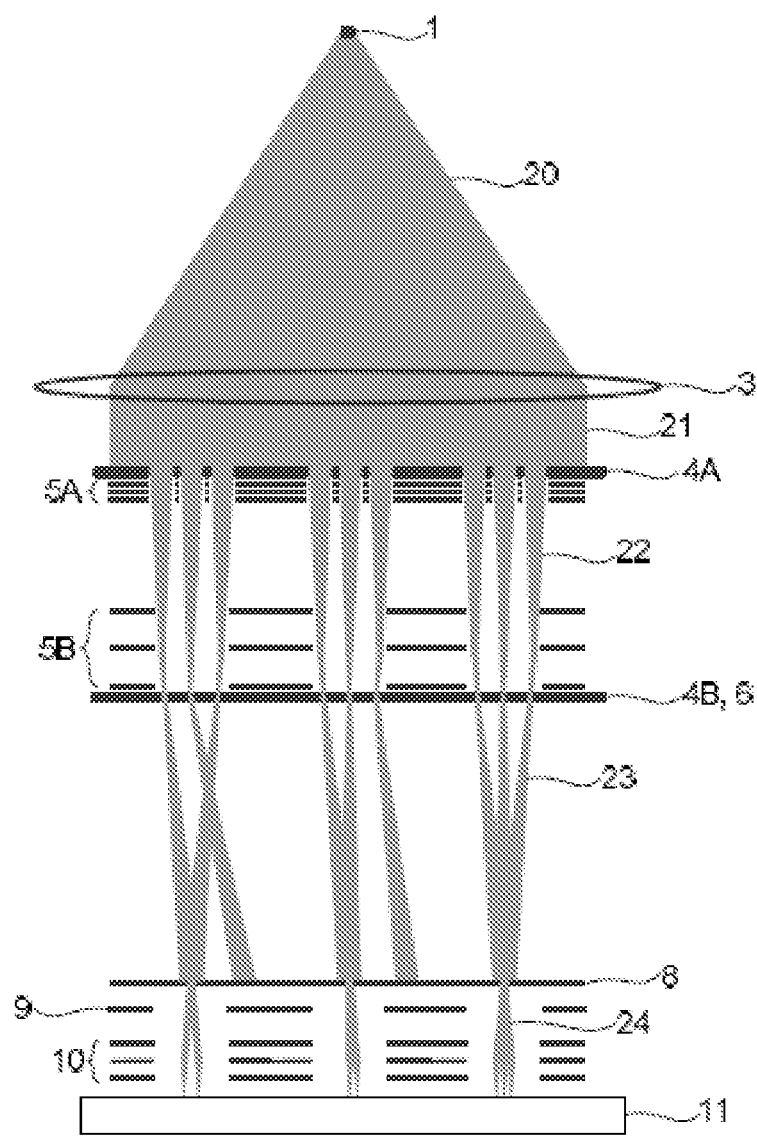
FIG. 4 is a simplified schematic overview of an embodiment of a charged particle multi-beamlet lithography system including grouped beamlets.

FIG. 4 illustrates one embodiment of a design according to the invention, for enabling an increased number of beamlets in the system, permitting increased current at the wafer or reduced spot size or both. The embodiment shown in FIG. 4 is constructed generally as described for the system of FIG. 1, except that the beamlets are arranged in groups so that multiple beamlets may be focused by a single projection lens system. In this embodiment, an aperture array 4A produces beamlets 22 from the collimated beam 21. The beamlets 22 are focused by condenser lens array 5A in the plane of a second aperture array 4B, with the result that the source 1 is imaged onto beamlet blanker array 6 (and also the aperture array 4B when this is integrated with the beamlet blanker array). The source 1 is in the focal plane of the collimating lens 3, which produces parallel beams in the collimated beam 21, and the beamlets 22 produced from collimated beam 21 are then focused in the plane of aperture array 4B.

The beamlets 22 are arranged as groups, and a second condenser lens array 5B focuses each group of beamlets approximately in the plane of beam stop array 8 and towards a corresponding aperture in beam stop array 8. The beamlets are thus focused in front of the target 11. In principle each group of beamlets can be concentrated (i.e. directed to a single point where they intersect and cross-over) either at the relevant aperture of beam stop array 8, or at the effective lens plane of the relevant projection lens system. In practice it is preferred to concentrate the beamlets somewhere between these two points. Concentrating the beamlets at the beam stop array may create a lens error, while concentrating the beamlets at the effective lens plane of the projection lens may cause a dose error. Alternatively, a group deflector array 5B can be provided instead of a second condenser lens array, providing a deflector for each beamlet. The group deflector array deflects the beamlets so that each group of beamlets converges to a cross-over point approximately at the plane of beam stop array 8, or the effective lens plane of the relevant projection lens system, or between these two points.

A beamlet blanker array 6 is positioned after the aperture array 4B. Note that beamlet blanker array 6 may alternatively be positioned before aperture array 4B, or the beamlet blanker array 6 may be integrated with the second aperture array 4B in a single component which functions as both the second aperture array and beamlet blanker array. The beamlet blanker array 6 operates, as in the system of FIG. 1, to deflect beamlets so that the deflected beamlets are blocked by beam stop array 8.

Beamlets which are not blanked (i.e. not deflected by beamlet blanker array 6) will fall on a corresponding aperture in beam stop array 8 and a central part of the unblanked beamlet will pass through the aperture and will be deflected by deflection array 9 and focused onto the target 11 by projection lens arrangement 10. This results in the beamlet blanker array 6 (and the aperture array 4B when integrated with the beamlet blanker array) being imaged onto the target 11. This has the benefit of greater stability in the system because errors in the size and positioning of lenses, apertures and other elements of the system upstream of the aperture array 4B will have reduced or no impact on the system downstream of aperture array 4B.

FIG. 4 shows three groups of three beamlets deflected by condenser array 5B, so that three beamlets are directed through each projection lens system in the end module 7. In this embodiment there are thus three times as many apertures in aperture array 4A, condenser lens array 5A, aperture array 4B, and beamlet blanker array 6, than there are projection lens systems formed in the end module 7. Although three beamlets per projection lens system is shown in FIG. 4, other numbers of beamlets per projection lens system may also be used, and groups of up to 100 beamlets or more can be directed through each projection lens system. In a preferred embodiment, groups of 49 beamlets in an array of 7 by 7 are deflected through each projection lens system. Although FIG. 4 shows the arrays 4A, 5A, 5B, 4B, and 6 being approximately the same size as the beam stop array 8 and other components of end module 7, they may be may larger, particularly for designs having a large number of beamlets per projection lens system which necessitates a larger number of apertures in the arrays 4A and 5A compared with the end module 7.

Preferably the apertures in the beam stop array 8, which define the beamlet opening angle, are relatively small as if they were limiting only a single beamlet. Larger apertures would require a larger deflection path, would be more susceptible to "tail" effects caused by only partial blanking of a blanked beamlet, and would further reduce the limited space available on beam stop array 8 for blanking beamlets.

In this design, with multiple beamlets passing through each projection lens system, the charged particle optics slit does not consist of a regular array of beamlets but of a regular array of groups of beamlets. At any instant some of the beamlets in a group may be directed through a corresponding opening in beam stop array 8 and projected onto the target, while other beamlets are deflected an additional amount by beamlet blanker array 6. This additional deflection causes these beamlets to miss the corresponding opening in beam stop array 8 so they are blocked from reaching the target, and are thereby blanked or "switched off" as described previously. In this way the beamlets are modulated, and each group of beamlets exposes a pattern determined by the beam blanker array 6, and each group can be considered as a single patterned beamlet.

Figure 5:
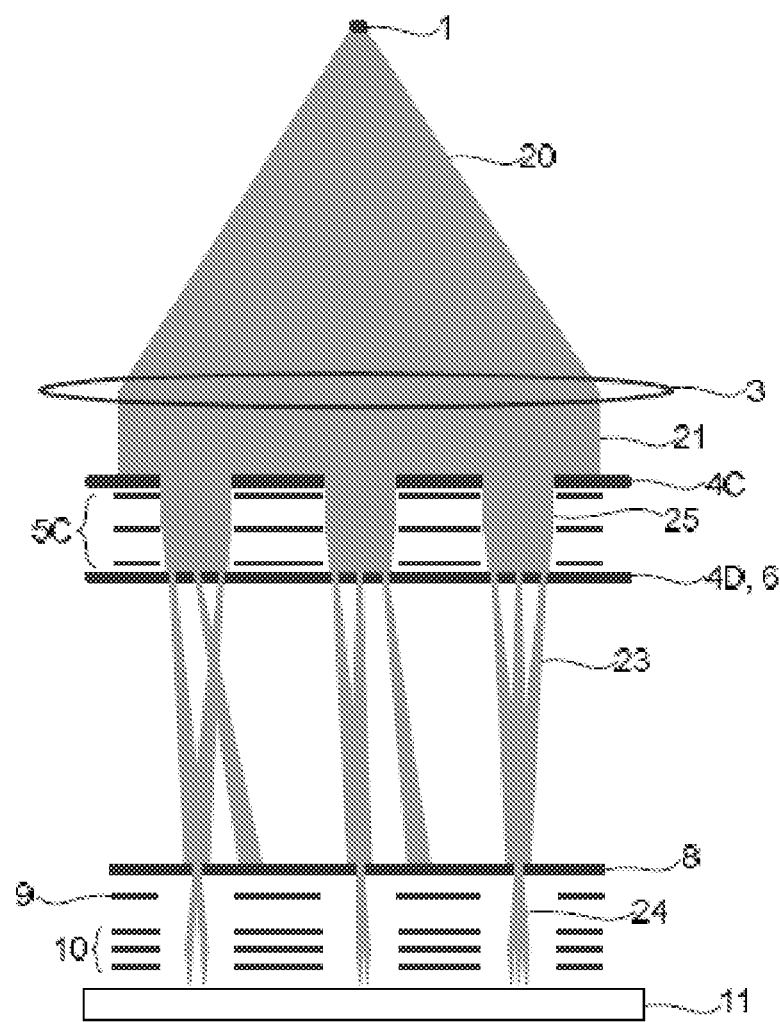
FIG. 5 is a simplified schematic overview of an embodiment of the charged particle multi-beamlet lithography system including beamlets formed from sub-beams.

While the system of FIG. 4 provides for multiple beamlets per projection lens system, it also results in a more complex system requiring two sets of condenser lens arrays 5A and 5B, and a total of six components in the embodiment shown where each condenser lens array comprises three substrates. This also results in a greater projection column length (greater distance from source to target) which is undesirable. The system typically operates in a vacuum chamber, and a longer column requires a larger and more expensive chamber. A longer column also increases the path length of the beamlets, increasing the effect of beamlet drift. FIG. 5 illustrates an alternative arrangement of the system which reduces the complexity and column length of the system.

The system of FIG. 5 includes an aperture array 4C to produce larger sub-beams 25. The sub-beams pass through a condenser lens array 5C focusing the sub-beams approximately in the plane of beam stop array 8 and at a corresponding opening in beam stop array 8. In principle each sub-beam can be focused either in the plane of beam stop array 8 or at the effective lens plane of the corresponding projection lens system, or somewhere between these two planes. This results in the source 1 being imaged onto this plane (i.e. the beam stop array 8 or the effective lens plane of the projection lens systems or a plane between them).

The sub-beams 25 impinge upon aperture array 4D which includes a number of apertures in the path of each sub-beam, thus producing a group of beamlets 23 from each sub-beam

25. The groups of beamlets, being formed from the sub-beams, are also focused in a plane at the beam stop array 8 or the effective lens plane of the projection lens systems or between them, and each group of beamlets is directed towards a corresponding opening in beam stop array 8.

Alternatively, a group deflector array can be provided after the aperture array 4D instead of condenser lens array 5C, providing a deflector for each beamlet 23. The group deflector array deflects the beamlets so that each group of beamlets converges to a cross-over point approximately at the plane of beam stop array 8, or the effective lens plane of the relevant projection lens system, or between these two points.

These beamlets 23 then pass through beamlet blanker array 6, which operates as previously described. Beamlets which are not blanked (i.e. not deflected by beamlet blanker array 6) will fall on a corresponding aperture in beam stop array 8 and a central part of the unblanked beamlet will pass through the aperture and will be deflected by deflection array 9 and focused onto the target 11 by projection lens arrangement 10. This results in the aperture array 4D being imaged onto the target 11. This has the benefit of greater stability in the system because errors in the size and positioning of lenses, apertures and other elements of the system upstream of the aperture array 4D will have reduced or no impact on the system downstream of aperture array 4D.

In the example shown in FIG. 5, the aperture array 4D produces a group of three beamlets 23 from each sub-beam 25. The group of beamlets, if undeflected by beam blanker array 6, strike the beam stop array 8 at a corresponding opening so that the three beamlets are projected onto the target by the projection lens system 10. In practice, a much larger number of beamlets may be produced for each projection lens system 10. In a practical embodiment, as many as 50 beamlets may be directed through a single projection lens system, and this may be increased to 200 or more.

As shown in FIG. 5, the beamlet blanker array 6 may deflect individual beamlets 23 in a group of beamlets at certain times in order to blank them. This is illustrated in FIG. 5 by the left-hand sub-beam 25, in which the middle beamlet 23 has been deflected to a location on the beam stop array 8 near to but not at an opening so that the beamlet is blanked. In the middle sub-beam 25 the right-hand beamlet 23 has been deflected and is blanked, and in the right-hand sub-beam 25 no beamlets are deflected and blanked.

The advantage realized in the embodiment of FIG. 5 is a system having multiple beamlets per projection lens while also reducing the number of components required to generate and focus the beamlets. Compared with the system of FIG. 4, the system of FIG. 5 requires only one condenser lens array (or alternatively a group deflector array) and reducing the number of condenser lens components from six to three in the embodiment shown. Fewer components permits a reduction in the length of the projection column, reducing the size and cost of system and the vacuum chamber housing the system, and reducing the effect of beamlet drift.

A disadvantage when compared to the system of FIG. 4 is the lower total current at the target. FIG. 4 generates beamlets directly from the collimated beam 21 and includes the additional condenser lens array 5A which focuses the beamlets onto aperture array 4B. The system of FIG. 5 generates the beamlets from the sub-beams using aperture array 4B, and omits condenser lens array 5A, resulting in lower transmission of the collimated beam 21 to the target. However, this disadvantage is reduced in systems having a large number of beamlets. In a preferred embodiment, the system of FIG. 5 generates approximately 13,000 sub-beams and approximately one million beamlets.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged particle multi-beamlet system for exposing a target using a plurality of beamlets, the system comprising:
    a charged particle source for generating a charged particle beam;
    a sub-beam aperture array for defining sub-beams from the generated beam,
    a beamlet aperture array for defining groups of beamlets from the sub-beams;
    a beamlet blanker array comprising an array of blankers for controllably blanking the beamlets;
    a beam stop array for blanking beamlets deflected by the blankers, the beam stop array comprising an array of apertures, each beam stop aperture corresponding to one or more of the blankers; and
    an array of projection lens systems for projecting beamlets on to the surface of the target,
    wherein the system images the source onto a plane at the beam stop array, at the effective lens plane of the projection lens systems, or between the beam stop array and the effective lens plane of the projection lens systems, and the system images the beamlet aperture array onto the target.

2. The system of claim 1, wherein the source is imaged onto a plane at or between the beam stop array and the effective lens plane of the projection lens systems by a condenser lens array.

3. The system of claim 2, wherein the condenser lens array is positioned upstream of the beamlet aperture array.

4. The system of claim 1, wherein the sub-beams are focused onto a plane at or between the beam stop array and the effective lens plane of the projection lens systems by a condenser lens array.

5. The system of claim 4, wherein the condenser lens array is positioned between the sub-beam aperture array and the beamlet aperture array.

6. The system of claim 1, wherein the beamlet aperture array and the beamlet blanker array are integrated.

7. The system of claim 1, wherein the apertures of the beam stop array are limiting the cross-section of beamlets passing therethrough.

8. A charged particle multi-beamlet system for exposing a target using a plurality of beamlets, the system comprising:
    at least one charged particle source for generating a charged particle beam;
    a first aperture array for creating sub-beams from the generated beam;
    a condenser lens array for focusing the sub-beams;
    a second aperture array for creating a group of beamlets from each focused sub-beam;
    a beamlet blanker for controllably blanking beamlets in the groups of beamlets; and
    an array of projection lens systems for projecting beamlets on to the surface of the target, wherein the condenser lens array is adapted for focusing each sub-beam at a point corresponding to one of the projection lens systems.

9. The system of claim 8, wherein the second aperture array is combined with the beamlet blanker array.

\* \* \* \* \*